United States Patent [19]

Sullivan et al.

[11] Patent Number: 5,530,676
[45] Date of Patent: Jun. 25, 1996

[54] METHOD AND APPARATUS FOR REDUCING POWER CONSUMPTION IN MEMORY CIRCUITS

[75] Inventors: Steven C. Sullivan; Michael L. Brauer, both of Austin, Tex.

[73] Assignee: Motorola, Inc., Schaumburg, Ill.

[21] Appl. No.: 379,807

[22] Filed: Jan. 27, 1995

[51] Int. Cl.⁶ ...................................................... G11C 7/00
[52] U.S. Cl. ..................... 365/227; 365/189.05; 365/233; 365/233.5
[58] Field of Search ..................... 365/227, 226, 365/233.5, 189.01, 189.05, 233, 194

[56] References Cited

U.S. PATENT DOCUMENTS 4,404,654  9/1983  Kamuro et al. ........................... 365/227
4,813,021  3/1989  Kai et al. ................................. 365/227

Primary Examiner—Tan T. Nguyen

[57] ABSTRACT

A clock signal (202) is received, wherein the rising edge of the clock signal (202) controls an operation of a memory cell (224) of a memory circuit (200). Address information (204) is received and predecoded prior to the rising edge of the clock signal (202) to produce a row select signal (210). A control signal (201), which is received prior to the rising edge of the clock signal, determines whether the operation is a read operation or a write operation. If the operation is a write operation, new data information (218) is received a data delay after the rising edge of the clock signal (202); the row select signal (210) is delayed such that the memory cell (224) is selected at least a data delay after the rising edge of the clock signal (202); and the new data information (218) is written to the memory cell (224).

4 Claims, 4 Drawing Sheets

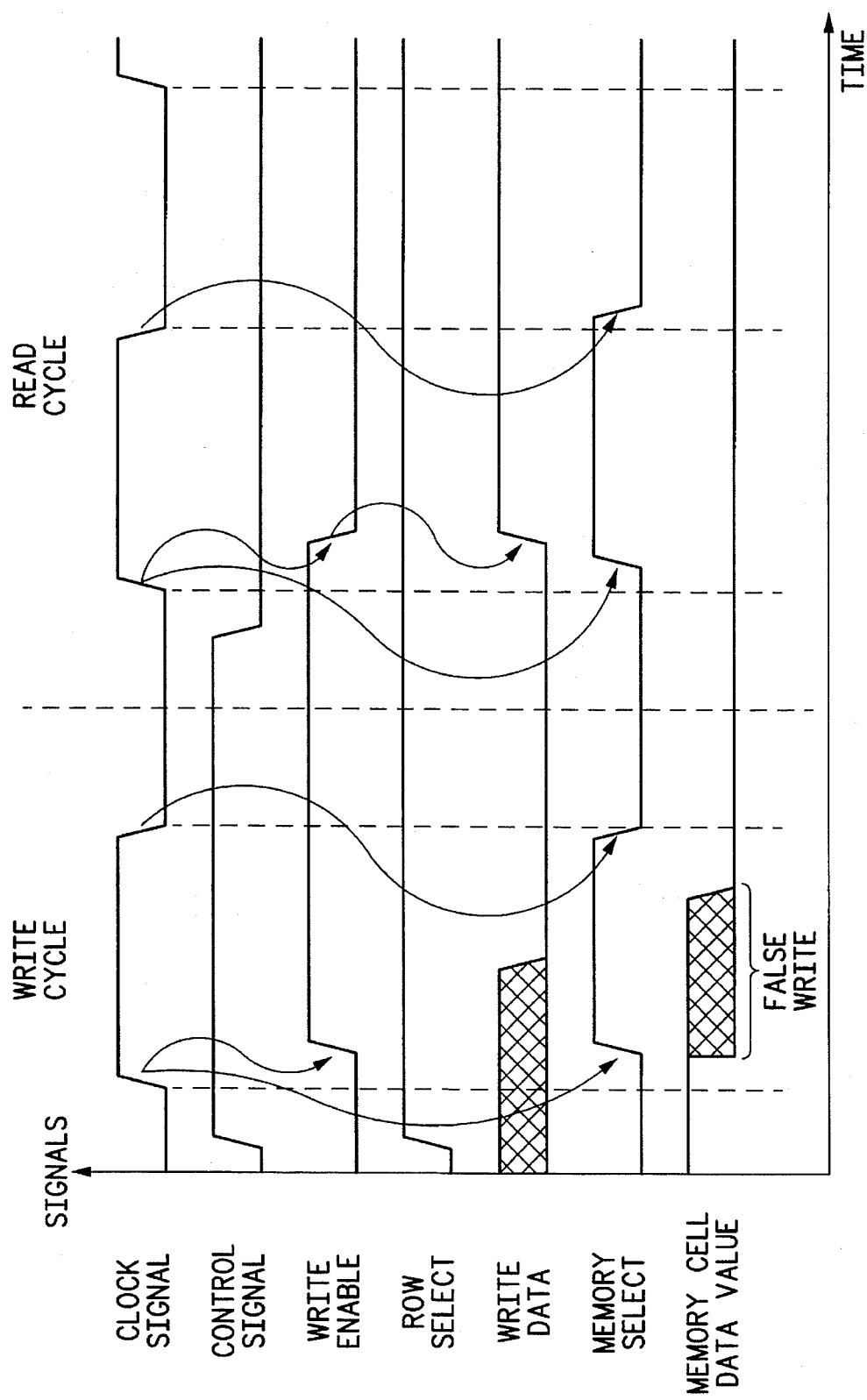
FIG.4 –PRIOR ART–

5,530,676

METHOD AND APPARATUS FOR REDUCING POWER CONSUMPTION IN MEMORY CIRCUITS

FIELD OF THE INVENTION

This invention relates generally to circuits and in particular to a method and apparatus for reducing power consumption in memory circuits.

BACKGROUND OF THE INVENTION

Data processing circuits often include memory circuits for the storage of instruction code and data in binary form. In memory structures such as Static Random Access Memories (SRAMs) and Dynamic Random Access Memories (DRAMs), the data is accessed via a read operation, and the data can be replaced with new data via a write operation. A portion of the memory block, or cell, to be read or written is selected using address signals, wherein decoding of the address signals is used to generate row-select signals that select the particular portion of the memory, or memory cell. Read and write operations are controlled by a clock signal which synchronizes timing and a control signal which determines whether a read or write operation is to take place.

In a data processing circuit that is highly optimized for speed, the time required to access the memory is crucial to the performance of the circuit. The speed of operation of a memory circuit can be measured relative to the period of the clock signal, wherein multiple periods, or cycles, of the clock signal may be required for a read or write operation. In some instances, one clock cycle is used to set up the address, control, and data signals, and the following clock cycle is used to perform the operation. In a more optimized technique, the second half of a cycle is used for setting up the address, control, and data signals, and the first half of the following cycle is used to perform the operation. This more optimized technique, which will be referred to as "cycle-stealing" requires only a single clock cycle (two-consecutive half-cycles) for each operation.

The access time of the memory is an important timing parameter for a read operation. In the case where the second half of the clock cycle is used to set up the address and control signals, the access time would be measured from the rising edge of the clock signal, which corresponds to the beginning of the clock cycle in which the operation is occurring. The access time is defined as the time between the rising edge of the clock signal and the appearance of valid data at the data outputs of the memory.

In order to minimize the access time of a memory circuit, the address signals are often pre-decoded such that the row-select signals produced by decoding the address signals are at their desired levels when the read operation begins. In a system using the cycle-stealing technique, having the row-select signals valid at the rising edge of the clock signal reduces the access time of a read operation, but two types of problems can arise during a write operation.

First, if the row-select signals propagate through the memory circuit more quickly than the control signal, a false read operation occurs when a write operation is intended. In most memory circuits, the write operation does correctly occur once the control signal propagates to the portion of the memory being selected, but excess power is consumed by the false read operations.

Second, if the control and row-select signals propagate to the portion of the memory being selected before the new data to be written is valid, false data is written to the cell. In most memory circuits, the correct data is written to the cell once the new data becomes valid, but once again, excess power is consumed by the false write operations.

Therefore, a need exists for a method and apparatus for reducing power consumption in memory circuits by eliminating false read and false write operations, while having a minimal effect on read operation access time.

BRIEF DESCRIPTION OF THE DRAWINGS

FIG. 4 illustrates, in a timing diagram, the timing relationship between signals in a prior-art memory circuit.

DETAILED DESCRIPTION OF THE DRAWINGS

Generally, the present invention provides a method and apparatus for reducing power consumption in memory circuits. This is accomplished by receiving a clock signal, wherein the rising edge of the clock signal controls an operation of a memory cell of the memory circuit. Address information is received and predecoded prior to the rising edge of the clock signal to produce a row select signal. A control signal, which is received prior to the rising edge of the clock signal, determines whether the operation is a read operation or a write operation. If the operation is a write operation, new data information is received a data delay after the rising edge of the clock signal; the row select signal is delayed such that the memory cell is selected at least the data delay after the rising edge of the clock signal; and the new data information is written to the memory cell. With such a method and apparatus, the present invention eliminates false read operations and false write operations, thereby reducing power consumption.

Figure 1:
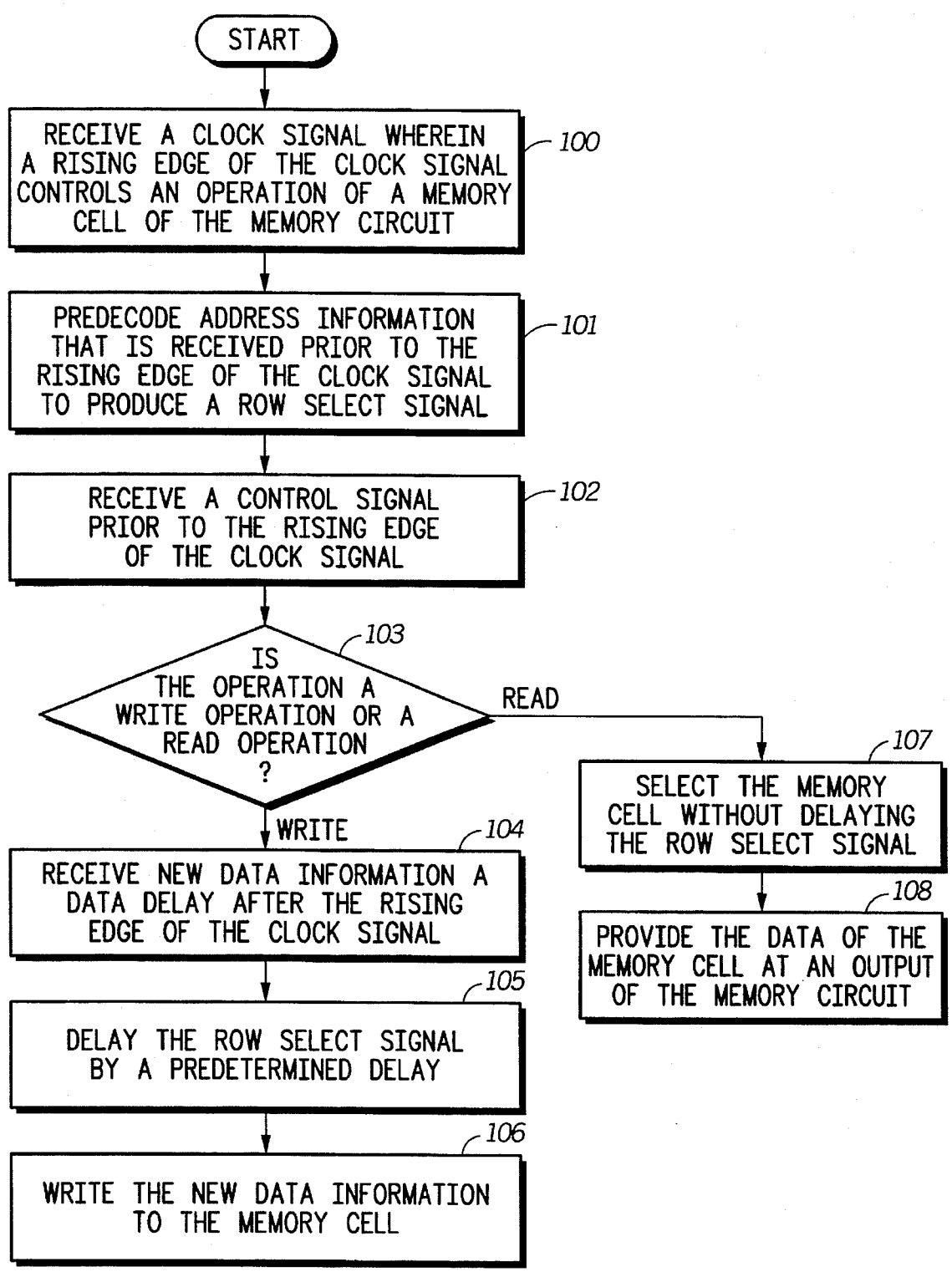
FIG. 1 illustrates, in a flowchart diagram, a method for reducing power consumption in memory circuits in accordance with the present invention.

FIG. 1 illustrates a logic diagram which may be used to implement an embodiment of the present invention. At step 100, a clock signal is received, wherein a rising edge of the clock signal controls an operation of a memory cell of the memory circuit. In a data processing system, this may be the clock that controls synchronization in the data processing system.

Address information, which is received prior to the rising edge of the clock signal, is predecoded in step 101 to produce a row select signal that selects a particular memory cell of the memory circuit. Memory circuits contain a plurality of memory cells, and the address information determines which of the memory cells are to be selected for a read or write operation. In step 102, a control signal is received prior to the rising edge of the clock signal, wherein the control signal determines, at step 103, whether the operation is a read operation or a write operation.

When a read operation is determined in step 103, the memory cell is selected in step 107 without delaying the row select signal. By not delaying the row select signal, the read operation performance of the memory circuit is not affected (the access time is not increased). At step 108, the read operation concludes when the data of the memory cell that has been selected is provided at an output of the memory circuit.

When a write operation is determined in step 103, new data information is received a data delay after the rising edge of the clock signal in step 104, wherein the new data information is the information that is to be written to the memory cell. The data delay is due to latching circuitry that captures the data on the rising edge of the clock signal and holds the value constant throughout the write cycle. In step 105, the row select signal is delayed by a predetermined delay based on the control signal and the clock signal. After being delayed, the row select signal selects the memory cell at least a data delay after the rising edge of the clock signal. By delaying the row select signal by the predetermined delay, it can be ensured that the new data information is valid, and the control signal has had adequate time to propagate to through the memory circuit to the memory cell. In order to ensure the validity of the data information, the predetermined delay must be greater than or equal to the data delay.

The memory cell is written with the new data information in step 106. Because the row select signal has been delayed to ensure the validity of the control signal and the new data information at the memory cell, false read operations and false write operations, which cause unnecessary switching and thus excess power consumption, are eliminated.

Figure 2:
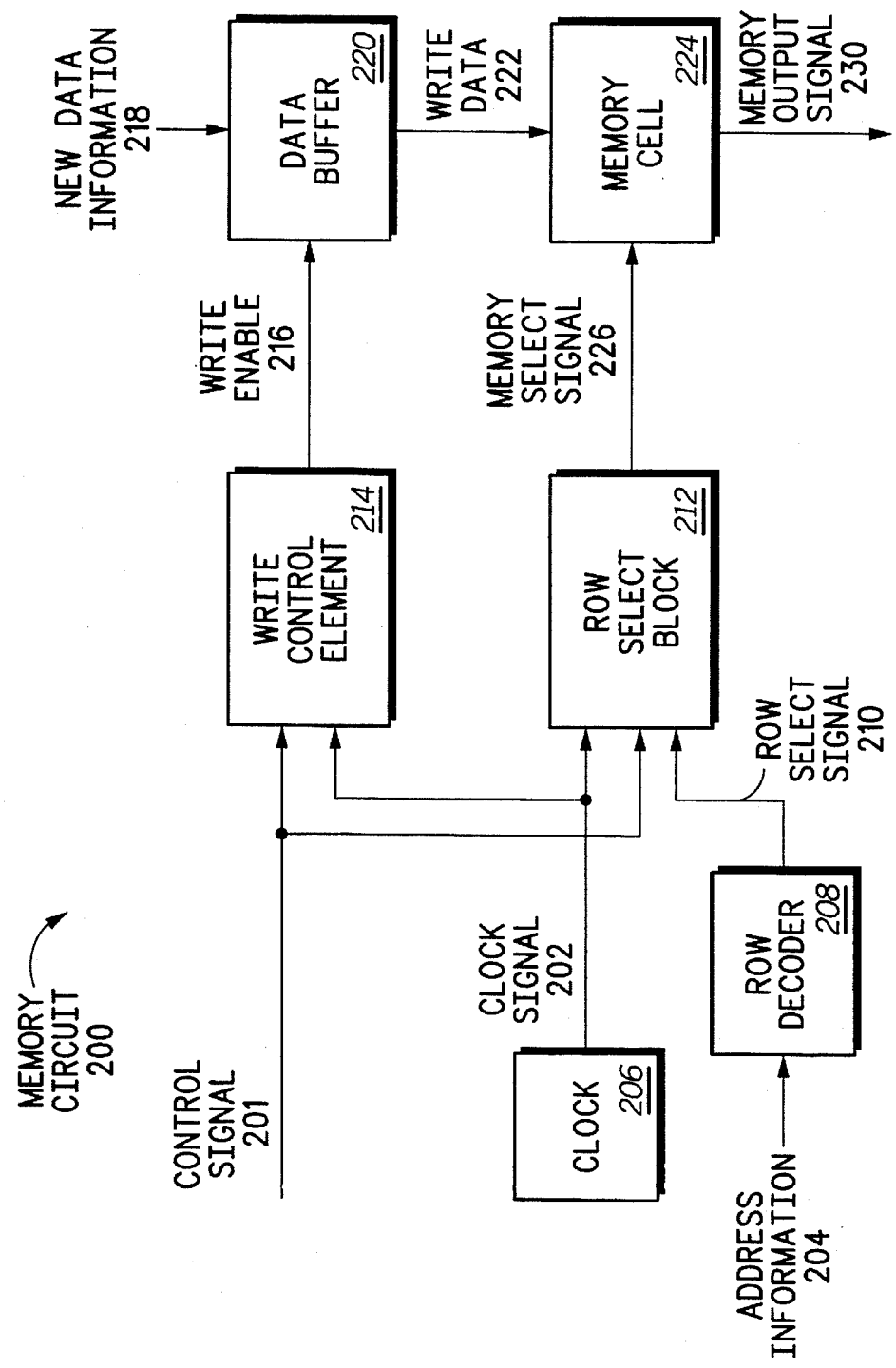
FIG. 2 illustrates, in a block diagram, a memory circuit in accordance with the present invention.

FIG. 2 illustrates a memory circuit 200 that is coupled to a clock 206 and includes a row decoder 208, a write control element 214, a row select block 212, a data buffer 220, and a memory cell 224. The memory cell 224 is used to store binary data information, and may be an SRAM memory cell, a DRAM memory cell, or another type of memory cell which allows both read and write operations.

The clock 206 produces a clock signal 202, wherein the rising edge of the clock signal 202 controls an operation of the memory cell. In other words, the timing of other signals in the circuit is relative to the rising edge of the clock signal 202. The row decoder 208 receives address information 204 prior to the rising edge of the clock signal 202 and predecodes the address information 204 to produce a row select signal 210. Because the address information 204 is received prior to the rising edge of the clock signal 202, the row select signal 210 is also valid before the rising edge of the clock signal 202.

The write control element 214 receives, prior to the rising edge of the clock signal 202, a control signal 201 which determines whether the operation is a read operation or a write operation. The write control element 214 also receives the clock signal 202 and produces a write enable signal 216 based on the rising edge of the clock signal 202 and the control signal 201. The write control element 214 may be comprised of a D-flip flop, wherein the D input of the D-flip flop is coupled to the control signal 201, the clock input of the D-flip flop is coupled to the clock signal 202, and the write enable signal 216 is produced at the Q output of the D-flip flop.

The data buffer 220 receives new data information 218 prior to the rising edge of the clock signal 202 and selectively couples the data information to the write data signal 222 based on the write enable signal 216. If the operation is a write operation, the write data 222 contains the new data information 218 a data delay period after the rising edge of the clock signal 202. Between the rising edge and a data delay after the rising edge, the write data signal 222 may be tri-stated (driven to a high-impedance state) or may contain false data information. If a read operation is selected, the write data signal 222 is tri-stated.

The row select block 212, produces a memory select signal 226 based on the clock signal 202, the control signal 201, and the row select signal 210. If the control signal 201 indicates that a read operation is to be performed and the row select signal 210 indicates that the operation is to be performed on the memory cell 224, the memory select signal 226 is immediately asserted after the rising edge of the clock signal 202 and is deasserted immediately after the falling edge of the clock signal 202. In a read operation, the write data signal 222 is tri-stated, and the contents of the memory cell 224 are driven onto the memory output signal 230.

If the control signal 201 indicates that a write operation is to be performed and the row select signal 210 indicates that the operation is to be performed on the memory cell 224, the memory select signal 226 is asserted at least the data delay after the rising edge of the clock signal 202. When the memory select signal 226 is asserted, the data on the write data signal 222 is written into the memory cell 224. During a write operation, the write data signal 222 contains valid new data to be written to the memory cell 224 a data delay after the rising edge of the clock signal 202. If the memory cell 224 is selected by the memory select signal 226 before the new data on the write data signal 222 is valid, invalid data is written to the memory cell 224. Delaying the memory select signal 226 by at least a data delay ensures that the write data signal 222 is valid when the memory cell 224 is selected, and thus the correct data is written to the cell.

Figure 3:
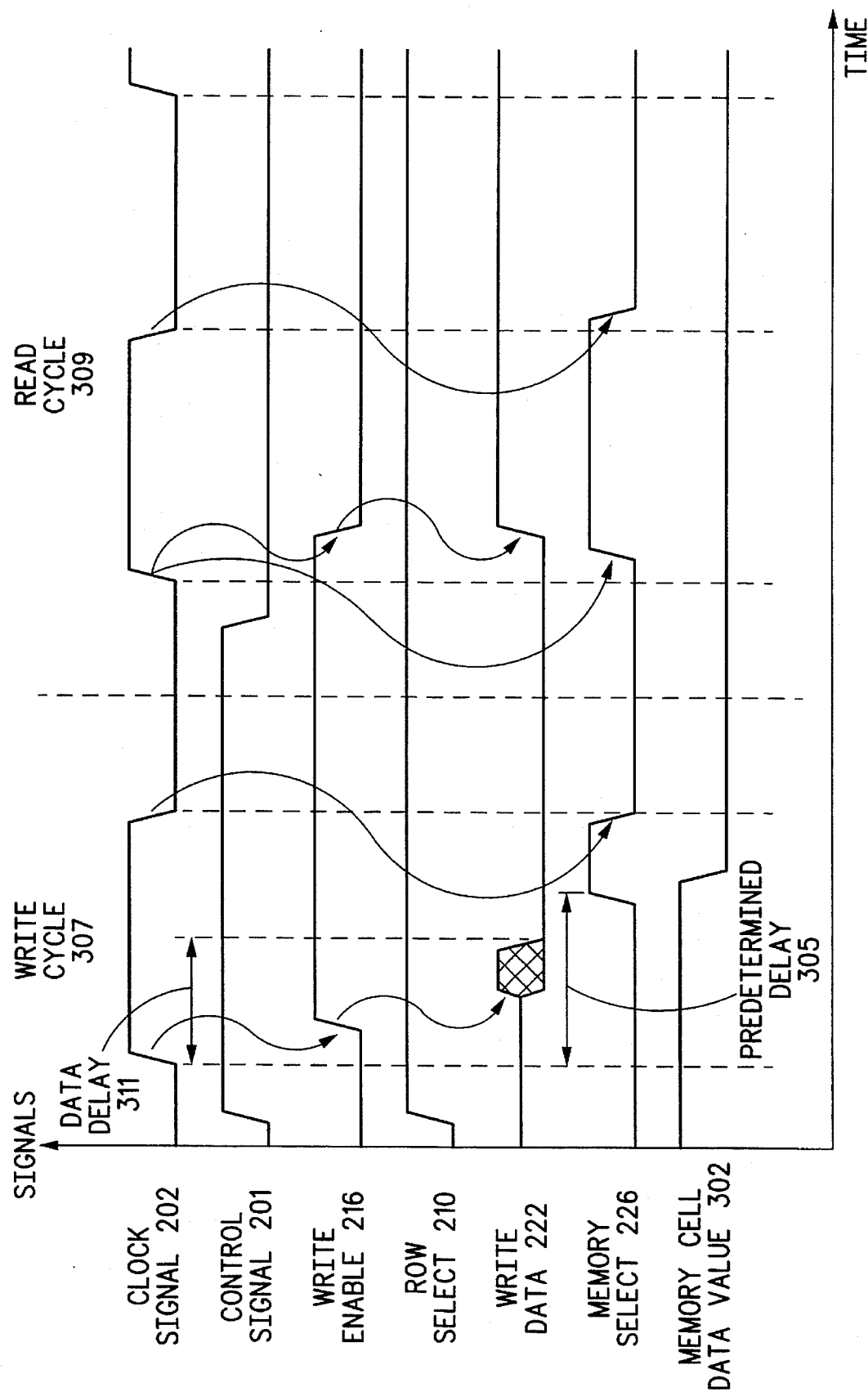
FIG. 3 illustrates, in a timing diagram, the timing relationship between the signals of FIG. 2 in accordance with the present invention.

FIG. 3 provides a timing diagram which illustrates the timing relationships that exist between the signals of FIG. 2 during a write cycle 307 and a read cycle 309. Clock signal 202 is shown as a periodic signal, wherein the edges of the clock signal 202 are used to control the timing of other signals in the memory circuit. As can be seen in FIG. 3, the control signal 201 transitions while the clock signal 202 is low such that the control signal 201 is valid prior to the rising edge of the clock signal 202. The write enable signal 216 is produced based on the control signal 201 and transitions following the rising edge of the clock signal 202, wherein a logic low value on the write enable signal 216 indicates that the write data signal 222 should be tri-stated (read cycle), and a logic high value indicates that the write data signal 222 should be driven with the data contained in the data buffer (write cycle).

The row select signal 210, which is obtained by predecoding the address information, is valid before the rising edge of the clock signal 202. A logic high value on the row select signal 210 indicates that the operation is to be performed on the particular memory cell. The write data signal 222 is shown to be tri-stated until the write enable signal 216 is driven to a logic high state, at which point the write data signal 222 is shown to be unknown as the data to be driven is not yet valid. The data to be driven is valid a data delay period 311 after the rising edge of the clock signal 202. In the read cycle 309, the write data signal 222 returns to a tri-state value when the write enable signal 216 is driven to a logic low.

In the write cycle 307, the memory select signal 226 is delayed by a predetermined delay 305 such that the memory select signal 226 is not asserted until the write data signal 222 is valid. When the memory select signal 226 is asserted (logic high), the memory cell data value 302 is written with the binary value contained in the write data signal 222. The memory select signal 226 is deasserted when the clock signal 202 returns to a logic low value. During a read cycle 309, the memory select signal 226 is not delayed as the write data signal 222 is not used and there is no need to wait for it to become valid. Thus, the read operation occurs without any extra delay being incurred.

The prior-art timing diagram is illustrated in FIG. 4. During the write cycle, a false write is shown to occur when the memory select signal is not delayed until after the write data is ensured of being valid. The unnecessary switching that occurs in the memory cell causes excess power to be consumed. Note that the read cycles in FIG. 3 and FIG. 4 are similar, indicating that the access time in the memory circuit which delays the memory select signal is not affected.

The present invention provides a method and apparatus for reducing power consumption in memory circuits. Typical prior art techniques suffer from excessive power consumption when unnecessary switching occurs due to false read operations or false write operations. By utilizing the method and apparatus described herein, false read and false write operations can be avoided during a write operations, thus eliminating the unnecessary switching and reducing power consumption.

What is claimed is:

1. A method for reducing power consumption of a memory circuit, the method comprising:

receiving a clock signal, wherein a rising edge of the clock signal controls an operation of a memory cell of the memory circuit;

predecoding address information that is received prior to the rising edge of the clock signal to produce a row select signal that selects the memory cell of the memory circuit;

receiving a control signal prior to the rising edge of the clock signal, wherein the control signal determines whether the operation is a read operation or a write operation; and when the operation is a write operation:
   i) receiving new data information a delay period after the rising edge of the clock signal, wherein the new data information is to be written to the memory cell;
   ii) delaying the row select signal by a predetermined delay based on the control signal and the clock signal such that the row select signal selects the memory cell at least the delay period after the rising edge of the clock signal; and
   iii) writing the new data information to the memory cell such that false read operations and false write operations are eliminated, thereby reducing power consumption.

2. The method of claim 1 further comprises:

when the operation is a read operation, selecting the memory cell without delaying the row select signal; and providing the data of the memory cell at an output of the memory circuit.

3. A memory circuit comprising:

a memory cell, wherein the memory cell is used to store data;

a row decoder, wherein the row decoder receives address information prior to a rising edge of a clock signal and produces, based on the address information, a row select signal;

a write control element that receives a control signal prior to the rising edge of the clock signal, wherein the control signal indicates whether an operation of the memory cell is a read operation or a write operation, and wherein the write control element produces a write enable signal based on the control signal and the clock signal;

a data buffer operably coupled to the memory cell, wherein the data buffer receives new data information a delay period after the rising edge of the clock signal and selectively couples the new data information to the memory cell based on the write enable signal; and a row select block operably coupled to the memory cell, wherein the row select block selects the memory cell based on the control signal, the row select signal, and the clock signal, and wherein, when the write operation is specified by the control signal, the row select block selects the memory cell at least the delay period after the rising edge of the clock signal.

4. The circuit of claim 3, wherein when the read operation is specified by the control signal, the row select block selects the memory cell directly after the rising edge of the clock signal.

* * * * *